(12) United States Patent
Su et al.

(10) Patent No.: US 8,649,131 B2
(45) Date of Patent: Feb. 11, 2014

(54) METHOD AND DEVICE FOR SUPERVISING SECONDARY CIRCUIT OF INSTRUMENT TRANSFORMER IN POWER SYSTEM

(75) Inventors: Bin Su, Beijing (CN); Jianzhong Fan, Beijing (CN); Lei Jing, Beijing (CN); Qianjin Liu, Beijing (CN); Jianping Wang, Vasteras (SE); Ying Yang, Beijing (CN)

(73) Assignee: ABB Research Ltd., Zurich (CH)

( * ) Notice: Subject to any disclaimer, the term of this patent is extended or adjusted under 35 U.S.C. 154(b) by 350 days.

(21) Appl. No.: 13/119,869

(22) PCT Filed: Sep. 24, 2008

(86) PCT No.: PCT/CN2008/072480
§ 371 (c)(1),
(2), (4) Date: Mar. 18, 2011

(87) PCT Pub. No.: WO2010/034149
PCT Pub. Date: Apr. 1, 2010

(65) Prior Publication Data
US 2011/0188159 A1   Aug. 4, 2011

(51) Int. Cl.
*H02H 7/04*   (2006.01)
(52) U.S. Cl.
USPC ............................................. 361/38; 361/80
(58) Field of Classification Search
USPC ....................................................... 361/80, 38
See application file for complete search history.

(56) References Cited

U.S. PATENT DOCUMENTS

| 5,396,172 A | 3/1995 | Lat et al. |
| 7,119,548 B1 | 10/2006 | Cook et al. |
| 7,755,872 B2 * | 7/2010 | Ortega ............................ 361/80 |
| 2007/0052426 A1 | 3/2007 | Wells et al. |

FOREIGN PATENT DOCUMENTS

| CN | 101170252 A1 | 4/2008 |
| JP | 2005045859 A1 | 2/2005 |

OTHER PUBLICATIONS

ISA/CN, International Search Report re Application No. PCT/CN2008/072480, issued Jun. 25, 2009, 3 pp.

* cited by examiner

*Primary Examiner* — Rexford Barnie
*Assistant Examiner* — Tien Mai
(74) *Attorney, Agent, or Firm* — Anthony M. Del Zoppo, III; Driggs, Hogg, Daugherty & Del Zoppo Co., LPA

(57) ABSTRACT

A method and a protection IED for supervising a secondary circuit of an instrument transformer in a power system are disclosed. The instrument transformer is connected to a power system component. The method includes: detecting, by a protection IED which is connected to the secondary circuit of the instrument transformer and protects the power system component, disturbances in a signal from the instrument transformer; and determining whether a failure occurs in the secondary circuit of the instrument transformer, according to both a disturbance detection result from the protection IED and another disturbance detection result from at least one of other protection IEDs. The other protection IEDs include protection IEDs which are connected to other secondary circuits of the instrument transformer or to secondary circuits of another instrument transformer connected to the power system component, and protection IEDs which are connected to other instrument transformers connected to other power system components connected to the same busbar as the power system component is connected to. The secondary circuit supervision solutions provide more reliable and sensitive performance and need very small amount of information to be collected.

18 Claims, 6 Drawing Sheets

METHOD AND DEVICE FOR SUPERVISING SECONDARY CIRCUIT OF INSTRUMENT TRANSFORMER IN POWER SYSTEM

RELATED APPLICATION

This application is a national filing of PCT application Serial No. PCT/CN2008/072480, filed Sep. 24, 2008.

FIELD OF INVENTION

The present application relates to the field of power system, and more particularly, to a method and device for supervising a secondary circuit of an instrument transformer in a power system.

BACKGROUND OF THE INVENTION

Instrument transformers are used to step-down current or voltage to measurable values, and are widely used in various power systems. There are two basic types of instrument transformers, i.e. voltage transformer and current transformer. A voltage transformer (VT, in the description also including Capacitive Voltage Transformer, CVT) is designed to reproduce accurately the primary voltage on the secondary side, while a current transformer (CT) is for current signals. The correct information about the primary values of voltages (from VT) and currents (from CT) are the basis for the correct operation of an intelligent electronic device (IED). However, failures may happen in the secondary circuits between the VT and the IED (this condition is referred to as VTfailure in the description) or between the CT and the IED (this condition referred to as CTfailure in the description), and result in unwanted operations of various protection functions of the IED. For example, VTfailure may cause a distance protection function to mal-operate. On the other hand, in the case of a CTfailure, a 'false' differential current will appear on the phase of CTfailure, and if the magnitude of this 'false' differential current is bigger than a startup threshold, the differential protection function may mal-operate. Furthermore, single-phase or double-phase CTfailure will result in a 'false' negative sequence current or zero sequence current, which will cause unwanted operations of negative/zero sequence current based protections. In order to avoid unwanted operations that may be caused by CTfailure or VTfailure, reliable, sensitive and high-speed Current Circuit Supervision and Voltage Circuit Supervision (also named as Fuse Failure Supervision) have always been very important.

Many methods for current/voltage circuit supervision have been developed. Several conventional solutions of current/voltage circuit supervision will be described below.

A) Current Circuit Supervision Methods

One current circuit supervision method is to compare the zero sequence current from a three phase set of current transformer windings with the neutral point current on a separate input taken from another set of windings on the current transformer. A detection of a difference indicates a fault in the circuit, and is used as alarm or to block protection functions expected to give unwanted tripping. This method needs customers to mix current circuits from different windings or different current transformers. Consequently this method increases the complexity of the hard wiring, and thus decreases the reliability of the IED. Furthermore, this method can not detect 3-phase CTfailure because under such conditions, there will be no zero sequence current in both windings or both current transformers.

Another current circuit supervision method is implemented by checking the presence of zero sequence current and zero sequence voltage. A high value of residual current without the presence of zero sequence voltage indicates CTfailure condition. However, this method can not detect 3-phase CTfailure because it is based on zero sequence measurements. Secondly, it can not work properly during asymmetrical operation condition (e.g. single-pole reclosing period) because there are always both zero sequence current and zero sequence voltage. Thirdly, it may mal-operate if the zero sequence impedance of the system is very small. Moreover, sometimes the voltage inputs are even not available.

Another current circuit supervision method is to detect the sudden disappearance of a phase current. However, when a fault occurs on a line that connects the power source and the load, the protection IED on the load side may also detect the sudden disappearance of the phase current, thus the CTfailure supervision function will operate incorrectly.

Another current circuit supervision method is based on changes in current flows connecting with the same busbar. Its theory is that internal or external faults will cause changes in at least two current flows, whereas a CTfailure only affect a single current flow. This method, however, requires sampled data from all the power system components (lines, transformers, etc) that are connected to the protected busbar, which means large amount of communication traffic and slow operation speed.

B) Voltage Circuit Supervision Methods

One Voltage circuit supervision method is to compare the measured zero sequence voltage under normal operating condition with a preset threshold. If the zero sequence voltage is bigger than the threshold, VTfailure will be detected. This method is useful only when there is no disturbance or fault, and thus a reliable start-up element that can detect disturbance or fault is needed. Furthermore, it is not applicable during asymmetrical operation conditions (e.g., single-pole reclosing period).

Another voltage circuit supervision method is implemented by checking the presence of zero/negative sequence current and zero/negative sequence voltage. A high value of zero/negative sequence voltage without the presence of the zero/negative sequence current indicates a VTfailure condition. This method can not detect 3-phase VTfailure. It can not work properly during unsymmetrical operation condition because there are always both zero/negative sequence current and zero/negative sequence voltage.

Another Voltage circuit supervision method is implemented by comparing the measured voltages from two separate sets of secondary windings of the voltage transformer. If the measured voltages of the same phase from two separate secondary windings of the voltage transformer are different, a VTfailure condition will be determined. This method needs measured voltages from two sets of secondary windings, which increases the complexity of the hard wiring, and thus decreases the reliability of the IED.

Furthermore, the above mentioned current/voltage circuit supervision methods based on both voltages and currents will fail if failures occur simultaneously on both current and voltage secondary circuits.

As shown in the above description, the existing methods either are unreliable under certain conditions or rely on large amount of communication.

Since the output of current/voltage circuit supervision functions are used to block relative protection functions (e.g., detection of VTfailure will block distance relay, while detection of CTfailure will block current differential protection) in order to avoid unwanted operations that otherwise may occur, the supervision functions must be reliable, sensitive and have short operate time to prevent unwanted operations from fast-acting, sensitive protection functions in case of failures in the current/voltage secondary circuits.

SUMMARY OF THE INVENTION

An object of the present invention is to provide a novel method and device for current/voltage circuit supervision with more reliable and sensitive performance and small amount of information to be collected, thus prevent unwanted operation of relevant protection functions.

According to an aspect of the present invention, there is provided a method for supervising a secondary circuit of an instrument transformer in a power system. The instrument transformer is connected to a power system component. The method includes:

detecting, by the protection IED which is connected to the secondary circuit of the instrument transformer and protects the power system component, disturbances in a signal from the instrument transformer; and determining whether a failure occurs in the secondary circuit of the instrument transformer, according to both a disturbance detection result from the protection IED and another disturbance detection result from at least one of other protection IEDs, the other protection IEDs comprising protection IEDs which are connected to other secondary circuits of the instrument transformer or to secondary circuits of another instrument transformer connected to the power system component, and protection IEDs which are connected to other instrument transformers connected to other power system components connected to the same busbar as the power system component is connected to.

According to another aspect of the present invention, there is provided a protection IED for supervising a secondary circuit of an instrument transformer in a power system. The instrument transformer is connected to a power system component which is protected by the protection IED. The protection IED includes:

a disturbance detecting module, connected to the secondary circuit of the instrument transformer and adapted to detect disturbances in a signal from the instrument transformer;

a determining module to which the disturbance detecting module is connected, adapted to determine whether a failure occurs in the secondary circuit of the instrument transformer, according to both a disturbance detection result from the disturbance detecting module and another disturbance detection result from at least one of other protection IEDs, the other protection IEDs comprising protection IEDs which are connected to other secondary circuits of the instrument transformer or to secondary circuits of another instrument transformer connected to the power system component, and protection IEDs which are connected to other instrument transformers connected to other power system components connected to the same busbar as the power system component is connected to; and an interface module connected to the determining module, adapted to send messages to and receive messages from the other protection IEDs.

By utilizing integrated information which is available via IEC 61850, the current/voltage circuit supervision solutions according to embodiments of the present invention provide more reliable and sensitive performance and very small amount of information needs to be collected.

BRIEF DESCRIPTION OF THE DRAWINGS

Various additional objects, features and advantages of the present invention can be more completely appreciated with reference to the detailed description and accompanying drawings that follow. In the drawings.

DESCRIPTION OF THE PREFERRED EMBODIMENTS

Figure 1:
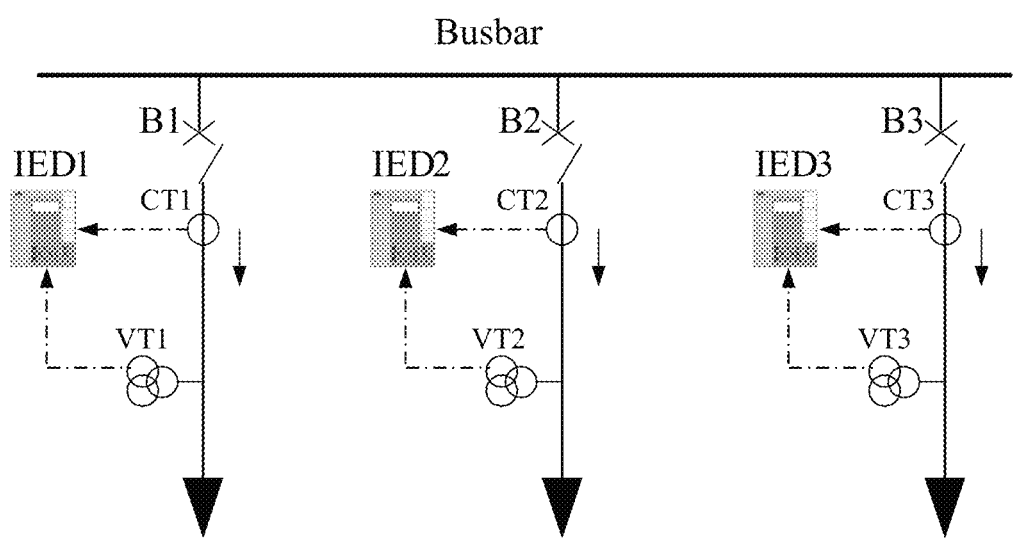
FIG. 1 is a diagram illustrating a typical secondary system configuration.

Throughout the following description, specific details are set forth in order to provide a more thorough understanding of the invention. However, the invention may be practiced without these particulars. In other instances, well known components have not been shown or described in detail to avoid unnecessarily obscuring the disclosure. Accordingly, the specification and drawings are to be regarded in an illustrative, rather than a restrictive, sense. In addition, like reference numerals designate like elements throughout the specification.

The embodiments of the present invention propose a novel current/voltage circuit supervision method and device by utilizing integrated information which may be available with a little communication traffic between protection IEDs in accordance with a common communication protocol, for example, Generic Object-Oriented Substation Event (GOOSE) defined by the IEC 61850 standard "Communication networks and systems in substations".

The above mentioned "integrated information" in this disclosure may have two meanings, by which two principles are proposed.

Principle 1: "integrated information" means the disturbance detection results from not only one protection IED protecting one power system component, but also from other protection IEDs protecting the other power system components, as long as the mentioned power system components are in operating condition and connected to the same busbar.

This principle can be explained by taking voltage circuit supervision as an example.

FIG. 1 is a diagram illustrating a typical secondary system configuration. For the purpose of illustration but not limitation, Principle 1 will be explained by utilizing the secondary system configuration shown in FIG. 1. For the secondary system configuration in FIG. 1, for example, the integrated information should include the disturbance detection results from the protection IEDs, i.e. IED1, IED2 and IED3, protecting three power system components (not shown) respectively. For an Extra-High Voltage (EHV) system, for example, the secondary voltage signals of the protection IEDs protecting different power system components are normally from different voltage transformers i.e. VT1, VT2 and VT3. When a fault or disturbance occurs in the power system, a voltage disturbance can be detected by all the protection IEDs IED1, IED2 and IED3 simultaneously. When a failure occurs in a secondary circuit of a VT, for example, between VT3 and IED3, only IED3 detects a voltage disturbance, but the other protection IEDs, i.e. IED1 and IED2, will not detect any disturbance. This difference between failures in secondary circuit and power system fault or disturbance conditions can be used for detecting the failure in the secondary circuit.

Principle 2: for a power system component with dual protection IEDs (a very common configuration in systems of 220 kV or above voltage levels), the two protection IEDs are connected to two voltage/current transformers or two secondary windings of a voltage/current transformer connecting the power system component, respectively. Thus the "integrated information" means the disturbance detection results from both the protection IEDs protecting the same power system component.

This principle can also be explained by taking voltage circuit supervision as an example.

Figure 2:
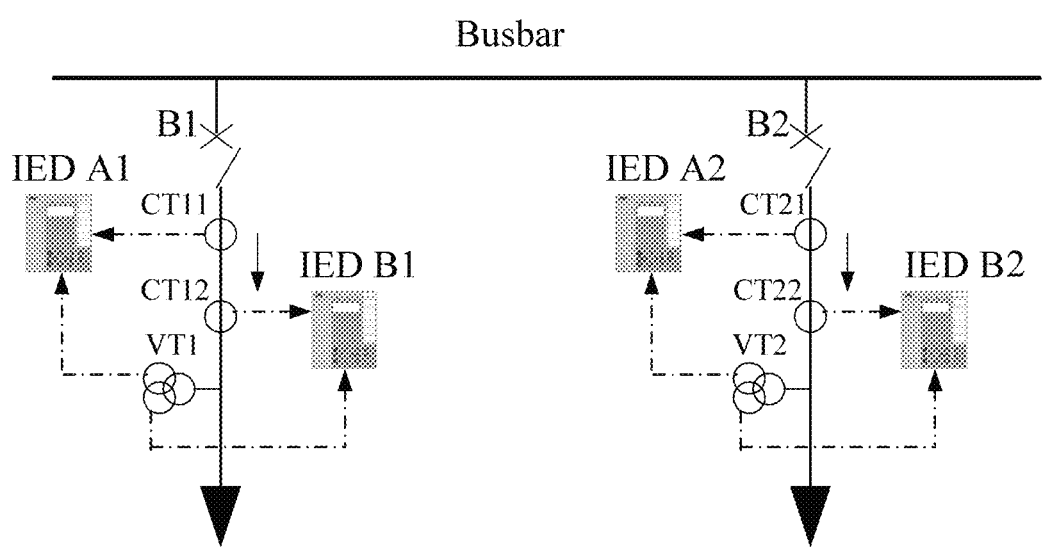
FIG. 2 is a diagram illustrating a typical secondary system configuration for dual protection IEDs.

FIG. 2 is a diagram illustrating a typical secondary system configuration for dual protection IEDs. For the purpose of illustration but not limitation, Principle 2 will be explained by utilizing the secondary system configuration shown in FIG. 2. For the secondary system configuration in FIG. 2, for example, the integrated information should include the disturbance detection results from IED A1 connecting to a first secondary winding of VT1 and the disturbance detection results from IED B1 connecting to a second secondary winding of VT1. When a fault or other disturbance occurs in the power system, both IED A1 and IED B1 will detect a voltage disturbance simultaneously. The condition that one protection IED (IED A1) detects a voltage disturbance while the other one (IED B1) does not, indicates that a failure occurs in the secondary circuit between the first secondary winding of VT1 and IED A1.

It should be note that the above two principles do not need each protection IED to collect all the voltage/current signals. Very small amount of information, i.e., disturbance detection results, exchanged between the protection IEDs is enough for such supervision process. Detailed implementations will be described hereunder with reference to the accompanying drawings.

Embodiment 1

This embodiment of the present invention complies with principle 1, and will be explained by taking voltage circuit supervision as an example.

Figure 3:
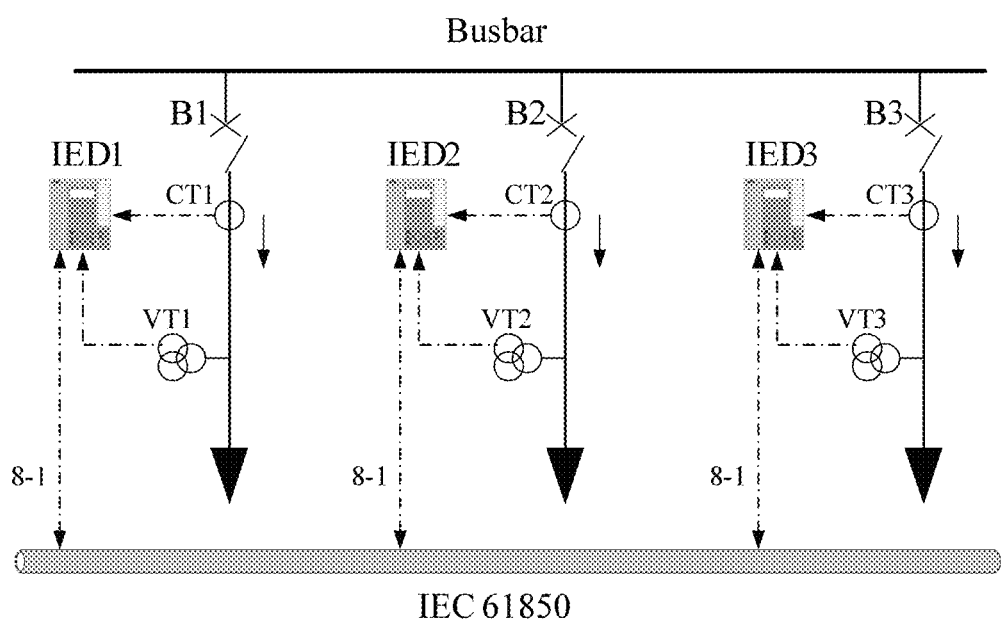
FIG. 3 is a diagram illustrating a secondary system configuration according to an embodiment of the present invention.
Figure 5:
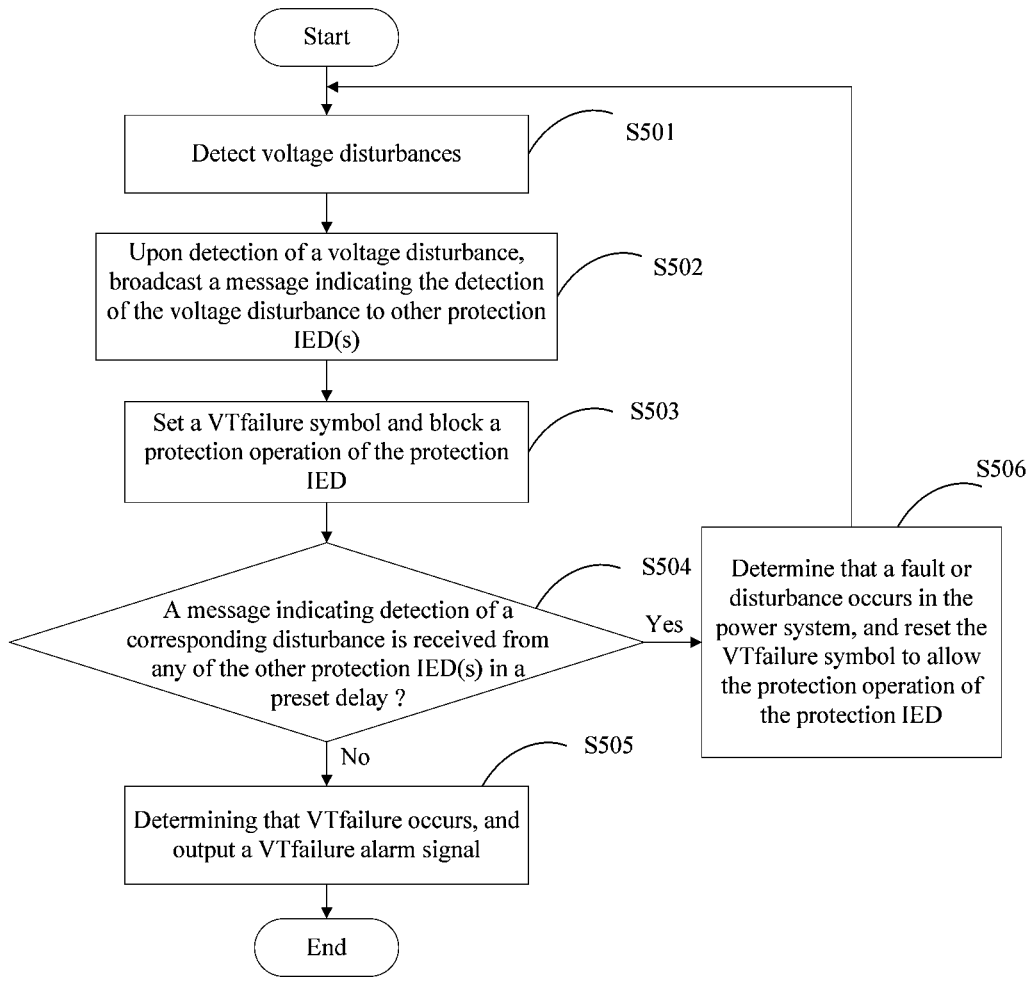
FIG. 5 is a flow chart illustrating a method according to an embodiment of the present invention.

A voltage circuit supervision method according to the embodiment of the present invention will be described hereunder with reference to FIGS. 3 and 5. FIG. 3 is a diagram illustrating a secondary system configuration according to an embodiment of the present invention. In FIG. 3, protection IEDs IED1, IED2 and IED3 are connected to VT1, VT2 and VT3 respectively and each protects a power system component (not shown) respectively. The three power system components are connected to the same busbar and are all in operating condition. The breakers B1, B2 and B3 are designed to switch on/off the connections between the power system components and the busbar respectively. FIG. 5 is a flow chart illustrating a method according to an embodiment of the present invention.

In the preferred embodiments of the present invention, each protection IED such as IED1, IED2 and IED3 can detect voltage disturbances, and once it (e.g., IED1) detects a voltage disturbance, it will inform the other protection IEDs (e.g., IED2 and IED3) that the disturbance is detected in which phase via a communication protocol, for example, via GOOSE (with reference sign "8-1" in FIG. 3). In the following example, the supervision process will be described in view of IED 1.

Referring to FIG. 5 in conjunction with FIG. 3, in block S501, IED1 detects voltage disturbances.

In block S502, upon detection of a voltage disturbance, IED1 broadcasts a message to other protection IEDs IED2 and IED3 via GOOSE. The message indicates the detection of the voltage disturbance. The message may also indicate in which phase the voltage disturbance is detected.

In block S503, IED1 sets a VTfailure symbol and blocks a protection operation of IED1.

If in a preset short delay (e.g. t1), IED1 gets a message from any of the other protection IEDs (e.g. IED2) and the massage indicates that IED2 detects a corresponding voltage disturbance, i.e. a voltage disturbance in the same phase in block S504, IED1 determines that there is a fault or disturbance occurred in the power system, and resets the VTfailure symbol to allow a proper operation of the protection IED IED1, in block S506. Then the process proceeds to block S501.

If in the preset short delay (e.g. t1), IED1 does not get a message indicating detection of a voltage disturbance in the same phase from any of the other protection IEDs (e.g. IED2, IED3) in block S504, IED1 determines that VTfailure occurs in block S505. Upon determination of the occurrence of VTfailure, IED1 may output a VTfailure alarm signal as desired.

The preset short delay t1 should be set according to the communication configuration (typically 10 ms is enough).

After the processing in block S505, VTfailure symbol of IED1 can be manually reset by an operator, or automatically reset by IED1 after the measured voltage signal satisfies a pre-defined reset logic, e.g. the voltage stays in a preset normal range for a preset period.

Embodiment 2

This embodiment of the present invention complies with principle 2, and will also be explained by taking voltage circuit supervision as an example.

Figure 4:
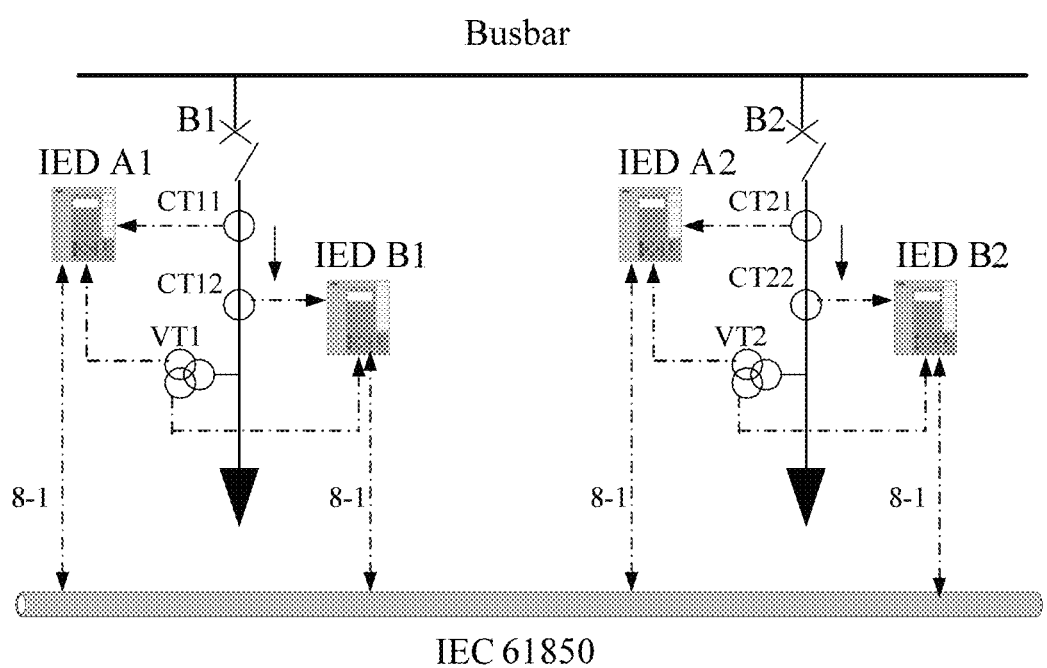
FIG. 4 is a diagram illustrating a secondary system configuration for dual protection IEDs according to another embodiment of the present invention.

In this embodiment, a voltage circuit supervision method according to the embodiment of the present invention will be described hereunder with reference to FIGS. 4 and 5. FIG. 4 is a diagram illustrating a secondary system configuration for dual protection IEDs according to another embodiment of the present invention. In FIG. 4, two protection IEDs, IED A1 and IED B1, are provided to protect a power system component (not shown) and two protection IEDs, IED A2 and IED B2, are provided to protect another power system component (not shown). The two power system components are connected to the same busbar. IED A1 is connected to a current transformer CT11 and a first secondary winding of a voltage transformer VT1. IED B1 is connected to a current transformer CT12 and a second secondary winding of the voltage transformer VT1. IED A2 is connected to a current transformer CT21 and a first secondary winding of a voltage transformer VT2, and IED B2 is connected to a current transformer CT22 and a second secondary winding of the voltage transformer VT2. CT11, CT12 and VT1 are connected to the power system component protected by IED A1 and IED B1, and CT21, CT22 and VT2 are connected to the power system component protected by IED A2 and IED B2.

In the following example, the supervision process will be described in view of IED A1.

Referring to FIG. 5 in conjunction with FIG. 4, in block S501, IED A1 detects voltage disturbances in the power system.

In block S502, upon detection of a voltage disturbance, IED A1 broadcasts a message to the other protection IED IED B1 via GOOSE. The message indicates the detection of the voltage disturbance. The message may also indicate in which phase the voltage disturbance is detected.

In block S503, IED A1 sets a VT failure symbol and blocks a protection operation of IED A1.

If in a preset short delay (e.g. t1), IED A1 gets a message from IED B1 and the massage indicates that IED B1 detects a corresponding voltage disturbance, i.e. a voltage disturbance in the same phase, in block S504, IED A1 determines that there is a fault or disturbance occurred in the power system, and resets the VT failure symbol to allow a proper operation of the protection IED IED A1, in block S506. Then the process proceeds to block S501.

If in the preset short delay (e.g. t1), IED A1 does not get a message indicating detection of a voltage disturbance in the same phase from IED B1 in block S504, the IED A1 determines that VT failure occurs in block S505. Upon determination of the occurrence of VT failure, IED A1 may output a VT failure alarm signal in block S505 as desired.

After the processing in block S505, the VT failure symbol of IED A1 can be manually reset by an operator, or automatically reset by IED A1 after the measured voltage signal satisfy a pre-defined reset logic, e.g. the voltage stays in a preset normal range for a preset period.

Of course, in the dual protection configuration as shown in FIG. 4, besides to IED B1, IED A1 may also broadcast the message to other protection IEDs for other power system components connected to the same busbar as the power system component protected by IED A1 is connected to, such as IED A2 and IED B2. The processing procedure is similar to that in Embodiment 1 and will not be repeated.

Embodiment 3

This embodiment of the present invention will be explained by taking current circuit supervision as an example.

This embodiment provides a current circuit supervision method in a power system with a secondary system configuration as shown in FIG. 3. The supervision method according to this embodiment is almost identical to that in Embodiment 1, except that in the method of this embodiment for supervising current circuit, what to be detected by the protection IEDs is a current disturbance. Accordingly, the messages communicated between the protection IEDs are designed slightly differently. Consequently, the detailed procedure of the supervision method will not be repeated.

Embodiment 4

This embodiment provides a current circuit supervision method in a power system with a secondary system configuration as shown in FIG. 4. The supervision method according to this embodiment is almost identical to that in Embodiment 2, except that in the supervision method of this embodiment for supervising current circuit, what to be detected by the protection IEDs is a current disturbance. Accordingly, the messages communicated between the protection IEDs are designed slightly differently. Consequently, the detailed procedure of the supervision method will not be repeated here.

It should be note that the proposed voltage circuit supervision and current circuit supervision methods can be fulfilled for each phase.

The proposed voltage circuit supervision and current circuit supervision methods are valid for both conventional and non-conventional instrument transformers, and are able to detect 1-phase, 2-phase and 3-phase failure in secondary circuit, under both 3-phase operating condition and 2-phase operating conditions.

The proposed method does not need an IED to collect the sampled data from other IEDs, but only needs to exchange the disturbance detection results between IEDs, thus the communication amount is very small. Consequently, this method possesses high reliability.

As one aspect of the proposed method, it is shown that IEC 61850 can be used to not only reduce conventional hard wirings, but also solve conventional problems and improve the protection performance.

It is understood that in the proposed methods, an IED needs to communicate with at least one of other IEDs which are connected to one or more other secondary circuits of instrument transformers connected either to the same power system component or to other power system components connected to the same busbar. So a status checking needs to be performed periodically by each IED to ensure the above condition exists. The above condition may not exist when only one power system component (one or more phases) is connected with the busbar, or only one IED is in operating condition among all the IEDs that protect the same power system component or the power system components connected with the same busbar, or the communication is out of service, etc. Traditional methods of voltage/current circuit supervision may also be included in the IEDs as backup in case the needed condition does not exist. However, it should be note that the possibility that the needed condition does not exist is very small. With the rapid development of communication technologies, the communication inside a substation is very reliable. The status check can be easily performed by IEDs with proper configuration by persons skilled in the art, and thus will not be described here.

Figure 6:
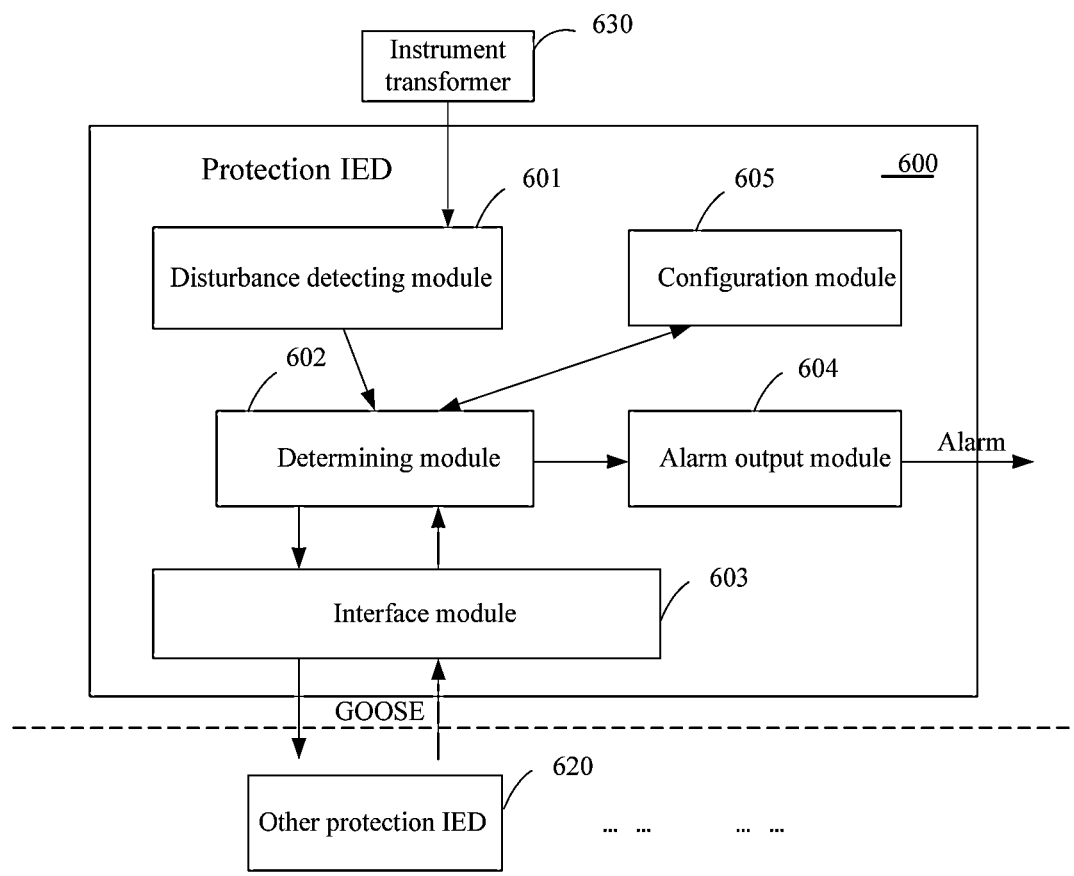
FIG. 6 is a block diagram illustrating a protection IED according to an embodiment of the present invention.

FIG. 6 is a block diagram illustrating a protection IED according to an embodiment of the present invention. Hereunder the protection IED according to the embodiment of the present invention will be described by taking voltage circuit supervision as an example.

Referring to FIG. 6, the protection IED 600 provides a secondary circuit supervision function, and is adapted to supervise a secondary circuit of an instrument transformer 630 in a power system. The instrument transformer 630 is connected to a power system component (not shown) which is protected by the protection IED 600. In view of this secondary circuit supervision function, the protection IED 600 includes a disturbance detecting module 601, a determining module 602 and an interface module 603.

The disturbance detecting module 601 is connected to the determining module 602, and is adapted to detect disturbances in a signal from the instrument transformer 630.

The determining module 602 is adapted to determine whether a failure occurs in the secondary circuit of the instrument transformer 630, according to both a disturbance detection result from the disturbance detecting module 601 and another disturbance detection result from at least one of other protection IEDs (e.g. IED 620). The other protection IEDs includes protection IEDs which are connected to other secondary circuits of the instrument transformer 630 or to secondary circuits of other instrument transformers connected to the power system component to which the instrument transformer 630 is connected, and protection IEDs which are connected to other instrument transformers connected to other power system components connected to the same busbar as the power system component is connected to.

The interface module 603 is connected to the determining module 602 and adapted to send/receive messages to/from the other protection IEDs, e.g., IED 620.

In an embodiment of the present invention, if the disturbance detecting module 601 detects a disturbance and the interface module 603 does not receive a message indicating detection of a corresponding disturbance from any of the other protection IEDs in a preset delay, the determining module 601 determines that the failure occurs in the secondary circuit between the instrument transformer 630 and the protection IED 600.

In another embodiment, if the disturbance detecting module 601 detects a disturbance and the interface module 603 receives a message indicating detection of a corresponding disturbance from any of the other protection IEDs in the preset delay, the determining module 602 determines that a fault or disturbance occurs in the power system.

In another embodiment, when the disturbance detect module 601 detects a disturbance, the determining module 602 sets a symbol to block a protection operation of the protection IED 600 and instructs the interface module 603 to broadcast a message indicating the detection of the disturbance to the other protection IEDs, e.g., IED 620. The message may also indicate in which phase the disturbance is detected.

In another embodiment, the determining module 602 resets the symbol to allow the protection operation of the protection IED 600 when it is determined that the fault or disturbance occurs in the power system.

The interface module 603 may send the messages to and receive the messages from the other protection IEDs via GOOSE defined by IEC 61850 standard.

The protection IED 600 may further include a configuration module 605 connected to the determining module 602. The configuration module 605 is adapted to preset the delay and other parameters needed to be set. The symbol may be manually reset by an operator via the configuration module 605.

The protection IED 600 may also include an alarm output module 604 according to another embodiment. The alarm output module 604 is adapted to output an alarm signal under control of the determining module 602. When it is determined that a failure occurs in the secondary circuit between the instrument transformer 630 and the IED 600, the determining module 602 instructs the alarm output module 604 to output an alarm signal indicating the occurrence of the failure in the secondary circuit.

The instrument transformer 630 may be a voltage transformer or a current transformer. In the case that the instrument transformer 630 is a voltage transformer, the disturbance is a voltage disturbance. In the case that the instrument transformer 630 is a current transformer, the disturbance is a current disturbance.

In an embodiment, the disturbance detecting module 601 is implemented as a super-imposed overvoltage relay for each phase. If the super-imposed overvoltage relay operates, it means that a disturbance is detected. The super-imposed voltage should be calculated with $$\Delta v(x) = v(x) - 2v(x-N) + (x-2N), \quad \text{(formula 1)}$$

where $\Delta v$ refers to the super-imposed voltage, v refers to the measured voltage, and N is the sampling points per power frequency cycle.

When the calculated super-imposed voltage is bigger than a threshold, the super-imposed overvoltage relay operates. The threshold of the overvoltage relay may be a preset value, or a preset percentage (e.g. 5%) of the voltage measured one cycle before or of the rated voltage, or a preset percentage (e.g. 150%) of the super-imposed voltage measured one cycle before, or a pre-defined combination of two or more of the above values.

It should be noted that though an exemplary disturbance detection method is described above, those skilled in the art will appreciate that there are many other disturbance detection methods.

Similarly, an embodiment of the protection IED 600 for current circuit supervision can also be easily understood by referring to FIG. 6, which will not be described here.

The modules and processes described above may be implemented in hardware, software, firmware, middleware, or combinations thereof.

For example, the method described above may be implemented in software and include computer code to perform the steps of the method. This computer code may be stored in a machine-readable medium, such as a processor-readable medium or a computer program product. The machine-readable medium or processor-readable medium may include any medium capable of storing or transferring information in a form readable and executable by a machine (e.g., a processor, a single chip microcomputer, or a computer, etc.).

For another example, the modules and processes described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing aspects of the invention include: microcontrollers with memory (such as electronically erasable programmable read only memory (EEPROM)), embedded microprocessors, firmware, software, etc.

It is understood that the examples and embodiments described herein are for illustrative purposes only, and various modifications or changes in light thereof will be suggested to persons skilled in the art and are to be included within the spirit and purview of this application and scope of the appended claims.

What is claimed is:

1. A method for supervising a secondary circuit of an instrument transformer in a power system, the instrument transformer being connected to a power system component, wherein the method comprises:

detecting, by a protection Intelligent Electronic Device (IED), which is connected to the secondary circuit of the instrument transformer and protects the power system component, disturbances in a signal from the instrument transformer; and determining whether a failure occurs in the secondary circuit of the instrument transformer, according to both a disturbance detection result from the protection IED and another disturbance detection result from at least one of other protection IEDs, the other protection IEDs comprising protection IEDs which are connected to other secondary circuits of the instrument transformer or to secondary circuits of another instrument transformer connected to the power system component, and protection IEDs which are connected to other instrument transformers connected to other power system components connected to a same busbar as the power system component is connected to; and wherein the determining whether the failure occurs in the secondary circuit of the instrument transformer comprises;

if a disturbance is detected by the protection IED and a message indicating detection of a corresponding disturbance is not received by the protection IED from any of the other protection IEDs in a preset delay, determining, by the protection IED, that the failure occurs in the secondary circuit of the another instrument transformer.

2. The method according to claim 1, wherein after the detecting, the method further comprises:
upon detection of a disturbance, broadcasting, by the protection IED, a message indicating the detection of the disturbance to the other protection IEDs, and setting, by the protection IED, a symbol for blocking a protection operation of the protection IED.

3. The method according to claim 2, wherein the method further comprises:
if it is determined that the fault or disturbance occurs in the power system, resetting the symbol to allow the protection operation of the protection IED.

4. The method according to claim 2, wherein the protection IED sends messages to and receives messages from the other protection IEDs via Generic Object-Oriented Substation Event, GOOSE, defined by IEC 61850.

5. The method according to claim 2, wherein the message broadcasted by the protection IED further indicates a phase of the disturbance, and the corresponding disturbance is a disturbance that occurs in a same phase as the disturbance detected by the protection IED occurs.

6. The method according to claim 1, wherein the instrument transformer is a voltage transformer or a current transformer; and wherein the disturbance is a disturbance in a voltage signal if the instrument transformer is a voltage transformer, and the disturbance is a disturbance in a current signal if the instrument transformer is a current transformer.

7. The method according to claim 1, further comprising:
upon detection of the disturbance, broadcasting, by the protection IED, a second message indicating the detection of the disturbance to the other protection IEDs, and setting, by the protection IED, a symbol for blocking a protection operation of the protection IED.

8. The method according to claim 1, wherein the instrument transformer is a voltage transformer or a current transformer; and wherein the disturbance is a disturbance in a voltage signal if the instrument transformer is a voltage transformer, and the disturbance is a disturbance in a current signal if the instrument transformer is a current transformer.

9. A method for supervising a secondary circuit of an instrument transformer in a power system, the instrument transformer being connected to a power system component, wherein the method comprises:
detecting, by a protection Intelligent Electronic Device (IED), which is connected to the secondary circuit of the instrument transformer and protects the power system component, disturbances in a signal from the instrument transformer; and
determining whether a failure occurs in the secondary circuit of the instrument transformer, according to both a disturbance detection result from the protection IED and another disturbance detection result from at least one of other protection IEDs, the other protection IEDs comprising protection IEDs which are connected to other secondary circuits of the instrument transformer or to secondary circuits of another instrument transformer connected to the power system component, and protection IED which are connected to other instrument transformers connected to other power system components connected to the same busbar as the power system component is connected to; and
wherein the determining whether the failure occurs in the secondary circuit of the instrument transformer occurs comprises:
if a disturbance is detected by the protection IED and a message indicating detection of a corresponding disturbance is received by the protection IED from the at least one of the other protection IEDs in a preset delay, determining, by the protection IED, that a fault or disturbance occurs in the power system.

10. The method according to claim 9, further comprising:
upon detection of the disturbance, broadcasting, by the protection IED, a second message indicating the detection of the disturbance to the other protection IEDs, and setting, by the protection IED, a symbol for blocking a protection operation of the protection IED.

11. The method according to claim 9, wherein the instrument transformer is a voltage transformer or a current transformer; and wherein the disturbance is a disturbance in a voltage signal if the instrument transformer is a voltage transformer, and the disturbance is a disturbance in a current signal if the instrument transformer is a current transformer.

12. A protection Intelligent Electronic Device (IED), for supervising a secondary circuit of an instrument transformer in a power system, the instrument transformer being connected to a power system component which is protected by the protection IED, wherein the protection IED comprises:
a disturbance detecting module, connected to the secondary circuit of the instrument transformer and adapted to detect disturbances in a signal from the instrument transformer;
a determining module to which the disturbance detecting module is connected, adapted to determine whether a failure occurs in the secondary circuit of the instrument transformer, according to both a disturbance detection result from the disturbance detecting module and another disturbance detection result from at least one of other protection IEDs, the other protection IEDs comprising protection IEDs which are connected to other secondary circuits of the instrument transformer or to secondary circuits of another instrument transformer connected to the power system component, and protection IED which are connected to other instrument transformers connected to other power system components connected to the same busbar as the power system component is connected to; and
an interface module connected to the determining module, adapted to send messages to and receive messages from the other protection IEDs; and
wherein the determining module is further adapted to determine that the failure occurs in the secondary circuit of the instrument transformer, if the disturbance detecting module detects a disturbance and the interface module does not receive a message indicating detection of a corresponding disturbance is received by the protection IED in a preset delay.

13. The protection IED according to claim 12, wherein the determining module is further adapted to determine that a fault or disturbance occurs in the power system, if the disturbance detecting module detects a disturbance and the interface module receives a message indicating detection of a corresponding disturbance from the at least one of the other protection IEDs in the preset delay.

14. The protection IED according to claim 13, wherein the determining module is further adapted to set a symbol to block a protection operation of the protection IED and instruct the interface module to broadcast a message indicating the detection of a disturbance to the other protection IEDs, when the disturbance detect module detects the disturbance.

15. The protection IED according to claim 12, wherein
the determining module is further adapted to set a symbol
to block a protection operation of the protection IED and
instruct the interface module to broadcast a message
indicating the detection of a disturbance to the other
protection IEDs, when the disturbance detect module
detects the disturbance.

16. The protection IED according to claim 15, wherein the
determining module is further adapted to reset a symbol to
allow the protection operation of the protection IED, when it
is determined that the fault or disturbance occurs in the power
system.

17. The protection IED according to claim 15, wherein the
interface module is further adapted to send messages to and
receive messages from the other protection IEDs via Generic
Object-Oriented Substation Event, GOOSE, defined by IEC
61850.

18. The protection IED according to claim 12, wherein the
determining module is further adapted to set a symbol to
block a protection operation of the protection IED and
instruct the interface module to broadcast a message indicating the detection of a disturbance to the other protection IEDs,
when the disturbance detect module detects the disturbance.

* * * * *